United States Patent
Scarzello et al.

(10) Patent No.: US 6,456,069 B1
(45) Date of Patent: Sep. 24, 2002

(54) FLUXGATE MAGNETIC FIELD SENSOR INCORPORATING FERROMAGNETIC TEST MATERIAL INTO ITS MAGNETIC CIRCUITRY

(75) Inventors: John F. Scarzello; John J. Holmes; Edward C. O'Keefe, all of Columbia, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/517,559

(22) Filed: Mar. 2, 2000

Related U.S. Application Data

(60) Provisional application No. 60/123,176, filed on Mar. 5, 1999.

(51) Int. Cl.[7] ......................... G01R 33/02; G01R 33/04; G01R 35/00
(52) U.S. Cl. ......................... 324/253; 324/202; 324/243
(58) Field of Search ................................. 324/228, 229, 324/230, 231, 232, 233, 234, 236, 237, 238, 239, 240, 241, 242, 243, 244, 247, 253, 254, 258, 260, 262, 202

(56) References Cited

U.S. PATENT DOCUMENTS

| | | | | |
|---|---|---|---|---|
| 3,611,120 A | * | 10/1971 | Forster | 324/225 |
| 3,821,637 A | | 6/1974 | Svala | 324/222 |
| 4,068,164 A | | 1/1978 | Schwartz et al. | 324/226 |
| 4,829,251 A | * | 5/1989 | Fischer | 324/230 |
| 5,008,621 A | | 4/1991 | Jiles | 324/227 |
| 5,124,641 A | * | 6/1992 | Netter et al. | 324/230 |
| 5,329,269 A | | 7/1994 | Watson | 336/213 |
| 5,469,053 A | * | 11/1995 | Laughlin | 324/207.18 |

OTHER PUBLICATIONS

Scarzello, John F. and Edward C. O'Keefe, "Development of Shipboard Magnetic Sensors for Degaussing System Controllers," NSWCCD–TR–98/011, Jun. 30, 1998, Machinery Research and Development Directorate Research and Development Report, Naval Surface Warfare Center, Carderock Division, West Bethesda, Maryland 20817–5700 ("Distribution limited to U.S. Government agencies and their contractors; test and evaluation (Jun. 30, 1998). Other requests for this document shall be referred to Carderock Division, Naval Surface Warfare Center (Code 854), West Bethesda, Maryland 20817–5700."). This report includes 93 pages, including 43 pages of drawings. Please note: A copy of this reference was appended to the patent application (Appendix A), and is thus not being provided herewith.

(List continued on next page.)

*Primary Examiner*—Edward Lefkowitz
*Assistant Examiner*—Reena Aurora
(74) *Attorney, Agent, or Firm*—Howard Kaiser

(57) ABSTRACT

A magnetic field sensor, for sensing the transverse component of the magnetic field intensity H, is based on fluxgate magnetometric principles and includes an "E"-shaped magnetic core. A drive winding is wound about the medial leg of the "E" shape. A sense winding is wound about the base of the "E" shape at the two locations between the medial leg and the extreme legs. A calibration winding is wound about each leg. Another magnetic field sensor, for sensing the normal component of the magnetic induction B, is also based on fluxgate magnetometric principles and includes a magnetic core having a sort of coaxial double cylindrical configuration wherein a basket-shaped cylinder encloses a smaller, solid cylinder. A drive winding, then a sense winding, then a calibration winding are wound over the solid cylinder. During operative placement of either inventive sensor in appropriate relation to a ferromagnetic surface, a closed magnetic flux path is manifested through the sensor and the ferromagnetic material; in effect, the ferromagnetic material is made a part of the sensor's transducer core.

20 Claims, 6 Drawing Sheets othpub

Lenz, James E., "A Review of Magnetic Sensors," *IEEE Proceedings*, vol. 78, No. 6, Jun. 1990, pp. 973–989.

Gordon, Daniel I., Robert E. Brown and John F. Haben, "Methods for Measuring the Magnetic Field," *IEEE Trans. Mag.*, vol. Mag–8, No. 1, Mar. 1972, pp. 48–51.

Gordon, Daniel I. and Robert E. Brown, "Recent Advances in Fluxgate Magnetometry," *IEEE Trans. Mag.*, vol. Mag–8, No. 1, Mar. 1972, pp. 76–82.

Gordon, D. I., R. H. Lundsten, R. A. Chiarodo, H. H. Helms, "A Fluxgate Sensor of High Stability for Low Field Magnetometry," *IEEE Transactions on Magnetics*, vol. MAG–4, 1968, pp. 379–401.

Acuna, M. H., "Fluxgate Magnetometers for Outer Planets Exploration," *IEEE Transactions on Magnetics*, vol. MAG–10, 1974, pp. 519–523.

Ripka, Pavel, "Review of Fluxgate Sensors," *Sensors and Actuators A*, (1992), pp. 129–141.

Ripka, Pavel, "Race–Track Fluxgate Sensors," *Sensors and Actuators*; A, 37–38 (1993), pp. 417–421.

Ripka, Pavel, K. Draxler, P. Kaspar, "Race–Track Fluxgate Gradiometer", *Electronic Letters*, 29 (1993), pp. 1193–1194.

Ripka, Pavel, "Magnetic Sensors for Industrial and Field Applications," *Sensors and Actuators A*, 42 (1994), Nos. 1–3, pp. 394–397.

Ripka, Pavel, F. Primdahl, I.V. Nielsen, J.R. Petersen, A. Ranta, "AC Magnetic Field Measurement Using the Fluxgate," *Sensors and Actuators A*, 46–47 (1995), pp. 307–311.

Ripka, Pavel, P. Kaspar, "Portable Fluxgate Magnetometer," *Sensors and Actuators A*, 68 (1998), pp. 286–289.

Russell, C.T., "The ISEE 1 and 2 Fluxgate Magnetometers," orig. in *Transactions on Geoscience Electronics*, vol. GE–16, No. 3, Jul. 1978; http://www–ssc.igpp.ucla.edu/personnel/russell/papers/ISEE_fluxgate/ (Feb. 4, 2000).

Russell, C.T., R.C. Snare, J.D.Means and R.C. Elphic, "Pioneer Venus Orbiter Fluxgate Magnetometer," orig. in *IEEE Transactions on Geoscience and Remote Sensing*, GE–18, 32–36, 1980; http://www–ssc.igpp.ucla.edu/personnel/russell/papers/Venus_fluxgate/ (Feb. 4, 2000).

Snare, Robert C., "A History of Vector Magnetometry in Space," Institute of Geophysics and Planetary Physics, University of California, Los Angeles; http://www–ssc.igpp.ucla.edu/personnel/russell/ESS265/History.html; (Feb. 4, 2000). http://www–ssc.igpp.ucla.edu/personnel/russell/ESS265)ess265_res01.GIF; http://www–ssc.igpp.ucla.edu/personnel/russell/ESS265/ess265_res02.GIF; http://www–ssc.igpp.ucla.edu/personnel/russell/ESS265/ess265_res03.GIF; http://www–ssc.igpp.ucla.edu/personnel/russell/ESS265/ess265_res04.GIF; http://www–ssc.igpp.ucla.edu/personnel/russell/ESS265/ess265_res05.GIF; http://www–ssc.igpp.ucla.edu/personnel/russell/ESS265/ess265_res06.GIF; http://www–ssc.igpp.ucla.edu/personnel/russell/ESS265/ess265_res07.GIF; http://www–ssc.igpp.ucla.edu/personnel/russell/ESS265/ess265_res08.GIF; http://www–ssc.igpp.ucla.edu/personnel/russell/ESS265/ess265_res09.GIF; http://www–ssc.igpp.ucla.edu/personnel/russell/ESS265/ess265_res10.GIF; http://www–ssc.igpp.ucla.edu/personnel/russell/ESS265/ess265_res11.GIF; http://www–ssc.igpp.ucla.edu/personnel/russell/ESS265/ess265_res12.GIF; http://www.ssc.igpp.ucla.edu/personnel/russell/ESS265/ess265_res13.GIF; http://www–ssc.igpp.ucla.edu/personnel/russell/ESS265/ess265_res14.GIF; http://www–ssc.igpp.ucla.edu/personnel/russell/ESS265/ess265_res15.GIF; http://www–ssc.igpp.ucla.edu/personnel/russell/ESS265/ess265_res16.GIF; http://www–ssc.igpp.ucla.edu/personnel/russell/ESS265/ess265_res17.GIF; (Feb. 4, 2000).

Ripka, Pavel, M. Tondra, J. Stokes and R. Beech, "AC–Driven AMR and GMR Magnetoresistors," *Sensors and Actuators A* (1999), vol. 76, pp. 227–232; attached copy is pdf version, observed at some time in 2000 at "Pavel Ripka's Homepage": http://measure.feld.cvut.cz/usr/staff/ripka/ripka_e.htm.

Ripka, Pavel, S.W. Billingsley, "Crossfield Effect at Fluxgate," *Sensors and Actuators* (2000), vol. 81, Nos. 1–3, pp. 176–179; attached copy is pdf version, observed at some time in 2000 at "Pavel Ripka's Homepage": http://measure.feld.cvut.cz/usr/staff/ripka/ripka_e.htm.

Ripka, Pavel, and F. Primdahl, "Tuned Current–Output Fluxgate," accepted for publication in *Sensors and Actuators A* (2000); attached copy is pdf preprint, observed at some time in 2000 at "Pavel Ripka's Homepage": http://measure.feld.cvut.cz/usr/staff/ripka/ripka_e.htm.

Ripka, Pavel, "New Directions in Fluxgate Sensors," accepted for publication in *JMMM* (2000); attached copy is pdf preprint, observed at some time in 2000 at "Pavel Ripka's Homepage": http://measure.feld.cvut.cz/usr/staff/ripka/ripka_e.htm.

Ripka, Pavel, "Race–Track Fluxgate with Adjustable Feedthrough," accepted for publication in *Sensors and Actuators A* (2000); attached copy is pdf preprint, observed at some time in 2000 at "Pavel Ripka's Homepage": http://measure.feld.cvut.cz/usr/staff/ripka/ripka_e.htm.

Ripka, Pavel, P. Kaspar, P. Navratil, A. Tipek, K. Svabova, "Fluxgate Magnetopneumography," Imeko World Congress, Osaka 1999; attached copy is pdf preprint, observed at some time in 2000 at "Pavel Ripka's Homepage": http://measure.feld.cvut.cz/usr/staff/ripka/ripka_e.htm Please note: the fourth of five pages could not be successfully printed out and hence is missing the attached copy.

Ripka, Pavel, S. Kawahito, "Processing of the Fluxgate Output Signal," Imeko World Congress, Osaka 1999; attached copy is pdf preprint, observed at some time in 2000 at "Pavel Ripka's Homepage": http://measure.feld.cvut.cz/usr/staff/ripka/ripka_e.htm.

Ripka, Pavel, "Magnetic Sensors for Traffic Control," ISMCR 1999; attached copy is pdf preprint, observed at some time in 2000 at "Pavel Ripka's Homepage": http://measure.feld.cvut.cz/usr/staff/ripka/ripka_e.htm.

Kaspar, P, Pavel Ripka, "Induction Coils: Voltage Versus Current Output," Imeko World Congress, Vienna 2000; attached copy is pdf preprint, observed at some time in 2000 at "Pavel Ripka's Homepage": http://measure.feld.cvut.cz/usr/staff/ripka/ripka_e.htm.

Ripka, Pavel, P. Kaspar, A. Tipek, K. Svabova, "Magnetic Lung Diagnostics Using Fluxgate," Imeko World Congress, Vienna 2000; attached copy is pdf preprint, observed at some time in 2000 at "Pavel Ripka's Homepage": http://measure.feld.cvut.cz/usr/staff/ripka/ripka_e.htm.

* cited by examiner

FLUXGATE MAGNETIC FIELD SENSOR INCORPORATING FERROMAGNETIC TEST MATERIAL INTO ITS MAGNETIC CIRCUITRY

CROSS-REFERENCE TO RELATED APPLICATIONS

This application claims the benefit of U.S. provisional application No. 60/123,176, filed Mar. 5, 1999, hereby incorporated herein by reference, entitled "Integrating Fluxgate Magnetometer and Spatially Integrating Magnetometer."

This application is related to U.S. nonprovisional application Ser. No. 09/262,932, filed Mar. 5, 1999, now U.S. Pat. No. 6,344,743 B1, hereby incorporated herein by reference, entitled "Standing Wave Magnetometer," joint inventors John J. Holmes and John F. Scarzello.

This application is related to U.S. nonprovisional application Ser. No. 09/517,560, filed Mar. 2, 2000, hereby incorporated herein by reference, entitled "Spatially Integrating Fluxgate Magnetometer Having a Flexible Magnetic Core," joint inventors John F. Scarzello, John J. Holmes and Edward C. O'Keefe.

This application is related to U.S. nonprovisional application Ser. No. 09/517,558, filed Mar. 2, 2000, now U.S. Pat. No. 6,278,272 B1, hereby incorporated herein by reference, entitled "Integrating Fluxgate Magnetometer," joint inventors John F. Scarzello, John J. Holmes and Edward C. O'Keefe.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present inventions relate to methods, systems and apparatuses for performing measurement pertaining to magnetic field, more particularly to such methods, systems and apparatuses for measuring a magnetic field at the surface of a ferromagnetic material.

Ships and submarines are constructed of ferromagnetic materials which produce magnetic field signatures, making them detectable and vulnerable to magnetic influence sea mines and detectable by airborne magnetic anomaly detection (MAD) and underwater electromagnetic surveillance systems.

To reduce the magnetic field signature of ships and submarines, coils are wrapped around the ferromagnetic hull, and fields produced which reduce the vessel's signature. In order to control the coil currents, a degaussing (DG) system must have sensors which accurately measure the signature-related magnetic fields, and control algorithms to extrapolate the spatially measured field values to regions under the ship, and adjust the coil currents to minimize the signature amplitude.

It is useful to measure magnetic fields near the hull of naval ships and submarines, so that such measured magnetic fields can be used to control advanced degaussing systems. A large number of "point" sensors are presently employed, but they are expensive and not capable of satisfying the need for measuring fields at all points along the circumference of a ship or submarine hull. It is important to measure these fields produced by local hull anomalies (welds, stresses, bulkheads, etc.) and material inhomogeneities at many locations, for more effective control of the ship's degaussing system. Ideally, by measuring the surface magnetic fields all over the hull (and thereby continuously monitoring the magnetic state of a ship or submarine hull), the magnetic field signature of the ship can be adjusted and maintained at a low level using an advanced degaussing system such as the U.S. Navy's Advanced Closed Loop Degaussing System, thereby maldng a ship less vulnerable to sea mine magnetic influence fuzes.

Advanced degaussing systems require accurate and spatially distributed magnetic field measurements around the ship, so that ship mathematical model algorithms can precisely control magnetic field signatures below the ship. Some of the problems associated with measuring these fields include: large spatial gradient magnetic fields; local magnetic anomalies; induced magnetic fields caused by heading changes; and, permanent magnetization changes due to pressure-induced hull stresses. Such measurements have been made using traditional fluxgate magnetometers, short baseline gradiometers, etc.

In some cases, there are large spatial magnetic field gradients, close to the hull, which are produced by local hull anomalies (e.g., welds, stresses, bulkheads, etc.) and material inhomogeneities. "Point" triaxial fluxgate magnetometers and gradiometers are presently used to measure these spatial gradients; however, because of these local effects, field measurements at many locations may not be useful for controlling the shipboard degaussing system.

Fluxgate magnetometers measure the magnetic field intensity using a variety of transducer cores which, normally, are considered to be small "point" field sensors (typically, about one to two inches in length). More generally, fluxgate, fiber-optic and other magnetic field sensitive transducer phenomena measure the magnetic field intensity using a variety of transducer cores which are normally considered point field measurements (wherein the transducers are typically about one to two inches in length).

A ship or submarine with a ferromagnetic hull produces a magnetic field signature which is dependent on the hull material magnetic characteristics, it's geometry in the earth's magnetic field, and stresses which are applied to the hull. Present degaussing systems sense the magnetic fields relatively close to the hull, and adjust the degaussing coil currents to minimize the fields at a distance below the vessel which can be sensed by magnetic influence sea mines. The ferromagnetic hull material's characteristics are used in complex ship models which are able to predict a vessels magnetic field signature below the ship. However, the characteristics may change significantly with respect to stress, heading, and time.

Ferromagnetic material sample characteristics are presently measured using ASTM "Standard Methods of Testing Magnetic Materials, which include DC fluxmeter, and alternating current techniques; see *ASM Standard Methods of Testing Magnetic Materials,* A34-70, American National Standards Institute, Part 8, incorporated herein by reference. Other techniques include balance permeameters for feebly magnetic materials, and portable permeameters, sometimes used as "magnaflux probe" for non-destructive testing of structural materials; see Sery, R. S., *Permeameter Development and Use for Measuring Magnetic Permeability of SSN and High Strength Steels,* NSWC TR 80-347, Oct. 1, 1980, Naval Surface Weapons Center, White Oak, Md., incorporated herein by reference.

Other pertinent background information is provided by the following papers, each of which is hereby incorporated herein by reference: Lenz, J. E., "A Review of Magnetic Sensors," *IEEE Proceedings,* Vol. 78, No. 6, June 1990;Gordon, D. I., R. E. Brown and J. F. Haben, "Methods for Measuring the Magnetic Field," *IEEE Trans. Mag.,* Vol. Mag-8, No. 1, March 1972; Gordon, D. I. and R. E. Brown, "Recent Advances in Fluxgate Magnetometry," *IEEE Trans. Mag.,* Vol. Mag-8, No. 1, March 1972; Gordon, D. I., R. H. Lundsten, R. A. Chiarodo, H. H. Helms, "A Fluxgate Sensor of High Stability for Low Field Magnetometry," *IEEE Transactions on Magnetics,* vol. MAG-4, 1968, pp 379–401; Acuna, M. H., "Fluxgate Magnetometers for Outer Planets Exploration," *IEEE Transactions on Magnetics,* vol. MAG-10, 1974, pp 519–23.

SUMMARY OF THE INVENTION

In view of the foregoing, it is an object of the present invention to provide method, apparatus and system for measuring magnetic characteristics of a ferromagnetic material such as that of a ship's hull.

It is another object of the present invention to provide method, apparatus and system for continuously measuring same, for use in association with a magnetic control system such as a ship degaussing system.

All magnetic materials can be characterized by a hysteresis curve, which is a two dimensional plot of Induction (B in weber/$m^2$=$10^4$ gauss) versus Magnetic Field intensity (H in ampere/meter=0.01256 Oersted). The ratio of B/H is defined as the magnetic permeability of the material (weber/m-amp=henry/meter=newton/$amp^2$ or 1 hy/m=79.6×$10^3$ gauss/oersted), and varies non-linearly with respect to field amplitude, and mechanical stress.

At the surface of a ship or submarine hull or any ferromagnetic material, the normal component of the Induction (B) and the transverse component of Field Intensity (H) are each continuous across the surface boundary. The fields at the surface are dependent on the bulk material magnetic properties (permeability), which are dependent on the ambient magnetic field, the stress on the material which changes the characteristics of the magnetic material, and other local effects.

The "Ferromagnetic Surface Magnetic Field Sensor" ("FSMFS") in accordance with the present invention features measurement of magnetic field at the surface of a ferromagnetic material (e.g., at the surface of a ship's hull) by measuring either or both the transverse H field and the normal B (Induction), using the ferromagnetic properties of the material as part of the sensor transducer. This invention advantageously senses magnetic characteristics of ferromagnetic material while obviating the need to alter such material.

The present invention provides a fluxgate device for sensing the transverse component of the magnetic field intensity H at a surface area of a ferromagnetic entity. The inventive device comprises a magnetic core, a drive winding and two sense windings. The magnetic core generally describes a three-dimensional "E" shape. The magnetic core including four portions. The four portions are a base portion and three leg portions each projecting from the base portion. The three leg portions are a first end leg portion, a second end leg portion and a middle leg portion. The middle leg portion is approximately equidistantly interposed between the first end leg portion and the second end leg portion. The first end leg portion, the second end leg portion and the middle leg portion each have a leg end surface for being situated adjacent the surface area of the ferromagnetic entity when the device is positioned with respect to the ferromagnetic entity. The drive winding is wound over the middle leg portion. The two sense windings are a first sense winding and a second sense winding. The first sense winding is wound over the base portion between the first end leg portion and the middle leg portion. The second sense winding is wound over the base portion between the second end leg portion and the middle leg portion. Typically, the device further comprises three calibration windings. The three calibration windings are a first calibraton winding, a second calibration winding and a third calibration winding. The first calibration winding is wound over the first end leg portion. The second calibration winding is wound over the middle leg portion. The third calibration winding is wound over the second end leg portion.

The present invention also provides a fluxgate device for sensing the normal component of the magnetic induction B at a surface area of a ferromagnetic entity. The device comprises a magnetic core, a drive winding and a sense winding. The magnetic core generally describes a semi-open coaxial double-cylinder shape. The magnetic core includes an approximately cylindrical bucket-shaped portion and an approximately cylindrical solid portion. The approximately cylindrical solid portion has a smaller diameter than has the approximately cylindrical bucket-shaped portion. The approximately cylindrical bucket-shaped portion has an annular end surface. The approximately cylindrical solid portion has a continuous circular end surface. The annular end surface and the continuous circular end surface are for being situated adjacent the surface area of the ferromagnetic entity when the device is positioned with respect to the ferromagnetic entity. The drive winding is wound over the approximately cylindrical solid portion. The sense winding is wound over the approximately cylindrical solid portion. Typically, the device further comprises a calibration winding which is wound over the approximately cylindrical solid portion.

The purpose of the present invention, in the context of the U.S. Navy's effort, is to continuously measure magnetic characteristics of the material of a ship's hull at many locations, and to supply the measured data to the ship degaussing system's model-based control algorithms. The present invention's U.S. Navy prototype FSMFS is designed to measure a ferromagnetic hull's magnetic characteristics continuously. According to inventive principles, the B and H values of the surface properties of the hull can be determined by using the hull material itself as part of the transducer element. The inventive methodology dynamically measures, in real time, any change in hull magnetic characteristics including permanent magnetism, as well as induced magnetism and magnetization produced by hull stress.

Thus provided by the present invention is a type of ferromagnetic material (e.g., hull material) "permeameter." The invention's FSMFS can use either crystalline or amorphous magnetic materials in the transducer core. The U.S. Navy's prototype FSMFS sensor uses modified electronics which the U.S. Navy developed for its prototype IFM sensor.

Related to (but distinguishable from) the inventive FSMFS is the inventive "Integrating Fluxgate Magnetometer" (IFM) which is disclosed by the aforementioned U.S. Pat. No. 6,278,272 B1. A typical inventive Integrating Fluxgate Magnetometer (IFM) is a fluxgate magnetometer having a rigid transducer core which is configured as a long "race track" in order to integrate large component gradient magnetic fields near a ferromagnetic entity, e.g., a ship hull or a large piece of machinery. A typical inventive IFM: (i) measures magnetic fields over the length of its elongated transducer element (e.g., the 30 cm length of an inventive prototype tested by the U.S. Navy), and (ii) spatially integrates the component field amplitudes.

Also related to (but distinguishable from) the inventive FSMFS is the inventive "Spatially Integrating Magnetometer" (SIM) which is disclosed by the aforementioned U.S. nonprovisional patent application Ser. No. 09/517,560. A typical Spatially Integrating Magnetometer (SIM) measures the magnetic field at discrete distributed points, or summation of all field components, along a "linear," flexible transducer element. According to many inventive SIM embodiments, a spatially integrating transducer magnetometer measures the magnetic field components (tangential and normal) over a very long linear region, at discrete points, and integrates component field values (the sum of the field component amplitudes) over the length of the spatially integrating tranducer magnetometer's sensor element. A typical inventive SIM: (i) measures magnetic field amplitude components over a very long linear region, at discrete points, and (ii) integrates these component field values (the sum of the field component amplitudes) over the length of the transducer element.

Also related to (but distinguishable from) the inventive FSMFS is the inventive "Standing Wave Magnetometer" (SWM) which is disclosed by the aforementioned U.S. Pat. No. 6,344,743 B1. In accordance with many embodiments of the inventive SWM, a methodology is provided for determining the distribution of a magnetic field in a spatial sector. According to a typical inventive SWM, a magnetic field amplitude value is measured at each of a plurality of points in the sector, wherein the means for measuring is characterized by a length which is defined by the points. Alternating current is applied at a high frequency having an associated wavelength which corresponds to a multiple of the length. The applied alternating current is conducted so as to establish a standing wave along the length. The measured magnetic field amplitude values are processed; this processing includes performing, over the multiple of the length, Fourier analysis based on a harmonic bias function which results from the standing wave.

Other objects, advantages and features of this invention will become apparent from the following detailed description of the invention when considered in conjunction with the accompanying drawings.

BRIEF DESCRIPTION OF THE APPENDICES

Incorporated herein by reference is the following technical report: Scarzello, John F. and Edward C. O'Keefe, "Development of Shipboard Magnetic Sensors for Degaussing System Controllers," NSWCCD-TR-98/011, Jun. 30, 1998, Machinery Research and Development Directorate Research and Development Report, Naval Surface Warfare Center, Carderock Division, West Bethesda, Md. 20817-5700. See, especially, Chapter 6 of this report. This report includes 93 pages, including 43 pages of drawings.

BRIEF DESCRIPTION OF THE DRAWINGS

In order that the present invention may be clearly understood, it will now be described, by way of example, with reference to the accompanying drawings, wherein like numbers indicate the same or similar components, and wherein.

DETAILED DESCRIPTION OF THE INVENTION

Figure 1:
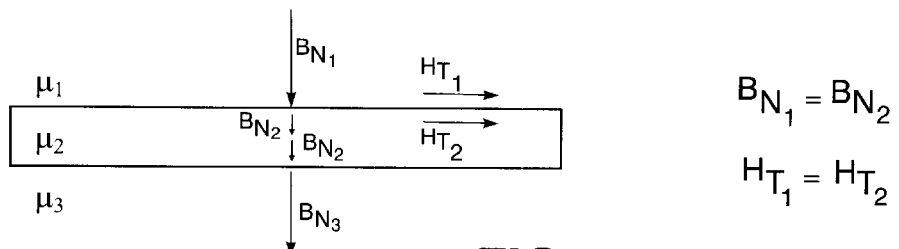
FIG. 1 is a diagrammatic representation of a ferromagnetic material, illustrating the Induction (B) and Field Intensity (H) components of the ferromagnetic material.
Figure 2:
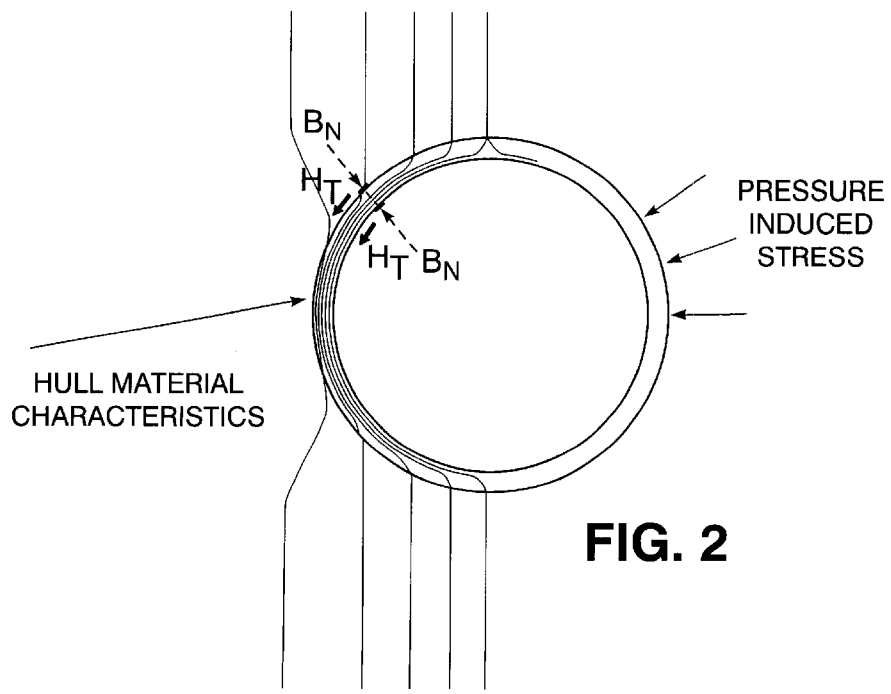
FIG. 2 is a diagrammatic representation of a ship's hull which is made of a ferromagnetic material, illustrating, similarly as does FIG. 1, the Induction (B) and Field Intensity (H) components of the hull.

Referring now to FIG. 1 and FIG. 2, a basis for the present invention is the existence of physical boundary conditions between a magnetic material 10 and a non-permeable medium (such as air 12), specifically the physical boundary conditions as pertains to the physical phenomena of magnetic induction (alternatively called magnetic flux density) B and magnetic field intensity (alternatively called magnetic field strength) H. At the surface 11 of a ship or submarine hull or any other ferromagnetic material 10, the normal component of the magnetic induction B and the transverse component of the magnetic field intensity R are each continuous across the surface 11 boundary.

As shown in FIG. 1 and FIG. 2, the induction B normal component is continuous across the boundary defined by first (upper, as shown) surface 11a and is continuous across the boundary defined by second (lower, as shown) surface 11b. Also as shown in FIG. 1 and FIG. 2, the field intensity h transverse component is continuous across the boundary defined by first (upper, as shown) surface 11a and is continuous across the boundary defined by second (lower, as shown) surface 11b.

Magnetic permeability is the measure of the ability of a material to modify a magnetic field, and is equal to the ratio of the magnetic induction B to the magnetic field intensity H. The magnetic fields at the surfaces 11a and 11b are dependent on the magnetic properties (magnetic permeability) of the bulk material 11. These magnetic properties are dependent on the ambient magnetic field, the stress on the material which changes the characteristics of the magnetic material, and other local effects. In particular, magnetic induction B and magnetic field intensity H in hull material 10 are a function of the ambient field, the degaussing coil fields, geometry, stress and temperature.

Figure 3:
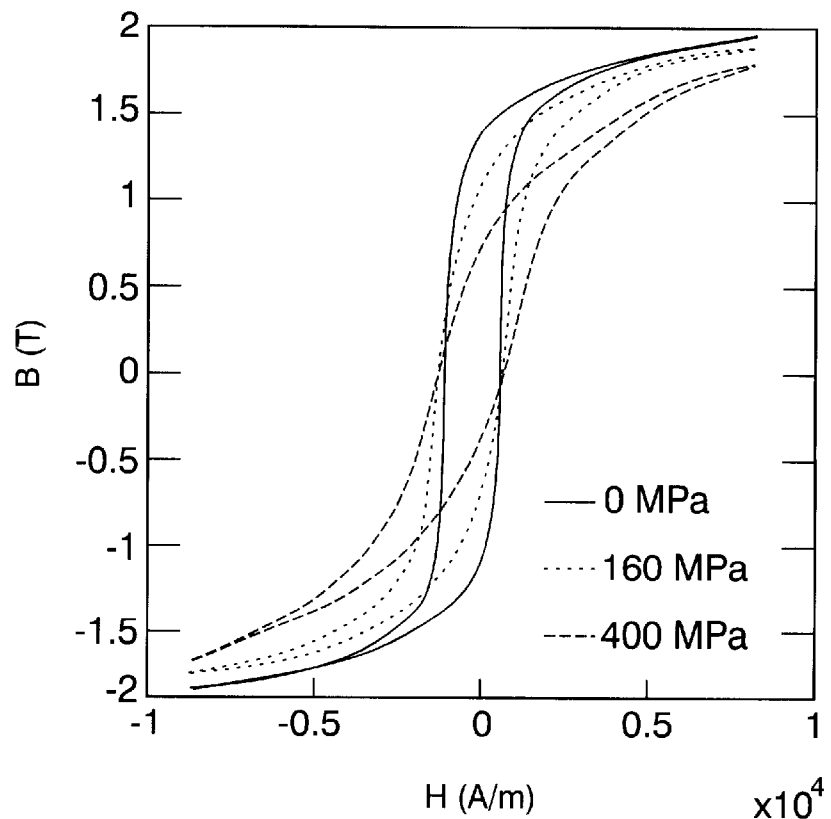
FIG. 3 is an exemplary graphical representation of magnetic induction as a function of applied magnetic field strength for positive transverse stress (tension) ranging from 0 to 400 Mpa. The stress results in an effective demagnetizing field which shears the hysteresis loop.
Figure 4:
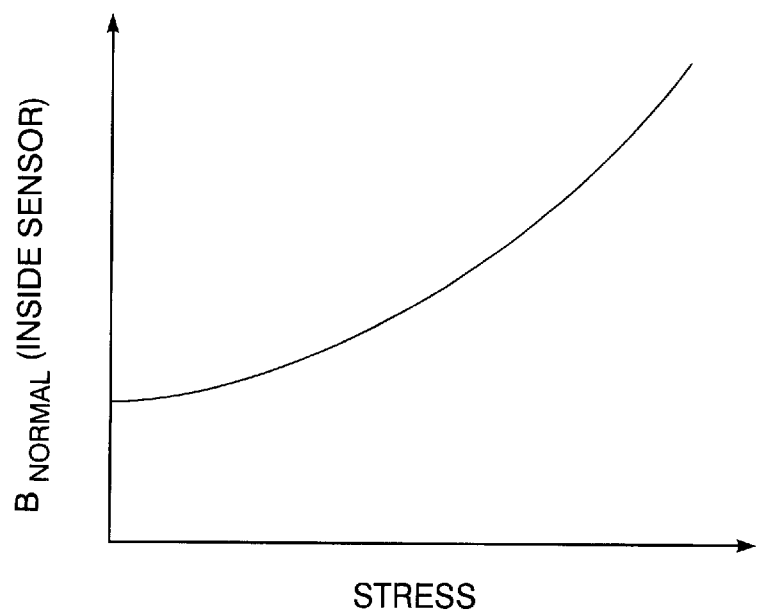
FIG. 4 is a graphical representation, related to FIG. 3, of the normal magnetic induction component as a function of stress.

For instance, with reference to FIG. 3, a ferromagnetic material's hysteresis curve is subject to various levels of pressure-induced stress, resulting in an effective demagnetization field which shears or degrades the hysteresis loop. With reference to FIG. 4, the normal B field component can be measured with respect to stress.

Figure 5:
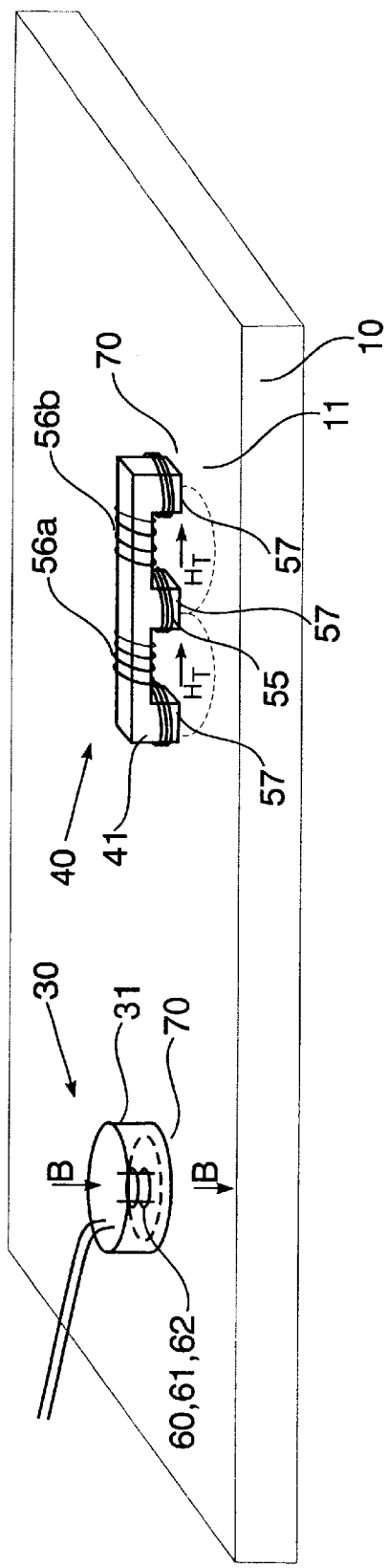
FIG. 5 is a diagrammatic perspective view, juxtaposed on a ferramagnetic surface such as a ship's hull surface, of the U.S. Navy prototype magnetic induction "Ferromagnetic Surface Magnetic Field Sensor" ("FSMFS") and the U.S. Navy prototype magnetic field intensity "Ferromagnetic Surface Magnetic eld Sensor" ("FSMFS"), in accordance with the present invention.

Reference now being made to FIG. 5, the ferromagnetic surface magnetic field sensor in accordance with this invention typically comprises the combination of two inventive kinds of ferromagnetic surface magnetic field sensors, viz., (i) the normal B field (magnetic induction) component sensor 30 and (ii) the transverse H field (magnetic field intensity) component sensor 40. It is emphasized that, in accordance with the present invention, either the B field component or the H field component can be measured in the absence of the other; however, many embodiments preferably implement both kinds of inventive transducers, in order to obtain a more complete assessment of the magnetic condition of the ferromagnetic material in question.

The U.S. Navy is interested in the present invention for utilization in relation to marine vessels. For many such applications, the inventive ferromagnetic surface magnetic field sensor can be aptly termed a "hull surface magnetic field sensor." The objective of the present invention's hull surface magnetic field sensor is to measure the hull's surface B and H parameters so that it may be possible to more fully determine the magnetic condition of the ship's hull. FIG. 1 and FIG. 2 illustrate the B and H components which can be inventively measured with surface sensors either inside or outside the hull, or both inside and outside the hull. If, for instance, both B and H surface fields are measured around the outside of the hull 10, advanced degaussing controller algorithms and degaussing coils can reduce signatures sufficiently to provide protection against magnetic influence sea mines and surveillance systems.

Fluxgate magnetometers have been developed to measure magnetic fields since the late 1930's. They use a ferromagnetic material as the transducer element, which is cyclically driven into saturation, which controls the flux in the core. To measure the controlled flux driven core plus that provided by the external or ambient magnetic field, the field dependent induced second harmonic signal of the saturated core is measured and compared to the second harmonic of the drive signal, whose amplitude is proportional to the ambient field intensity, with phase corresponding to field polarity.

The hull material transducer according to this invention utilizes a fluxgate magnetometer principle, but applies the principle to a transducer core that employs the hull material as part of the transducer element. In other words, according to this invention, the ferromagnetic material of the hull becomes part of the ferromagnetic material of the transducer circuit. By incorporating the ferromagnetic hull material, which has a different magnetic hysteresis curve than the well-defined transducer core, the boundary magnetic fields can be measured.

As illustrated in FIG. 5 through FIG. 9, an "E" core and a "Pot" core are used as the transducer elements for measurement of the $H_T$ (the transverse H field) component and the $B_N$ (the normal B field) component, respectively. Normal B field component sensor 30 includes magnetic Pot core 31. Transverse H field component sensor 40 includes magnetic E core 41.

Figure 6:
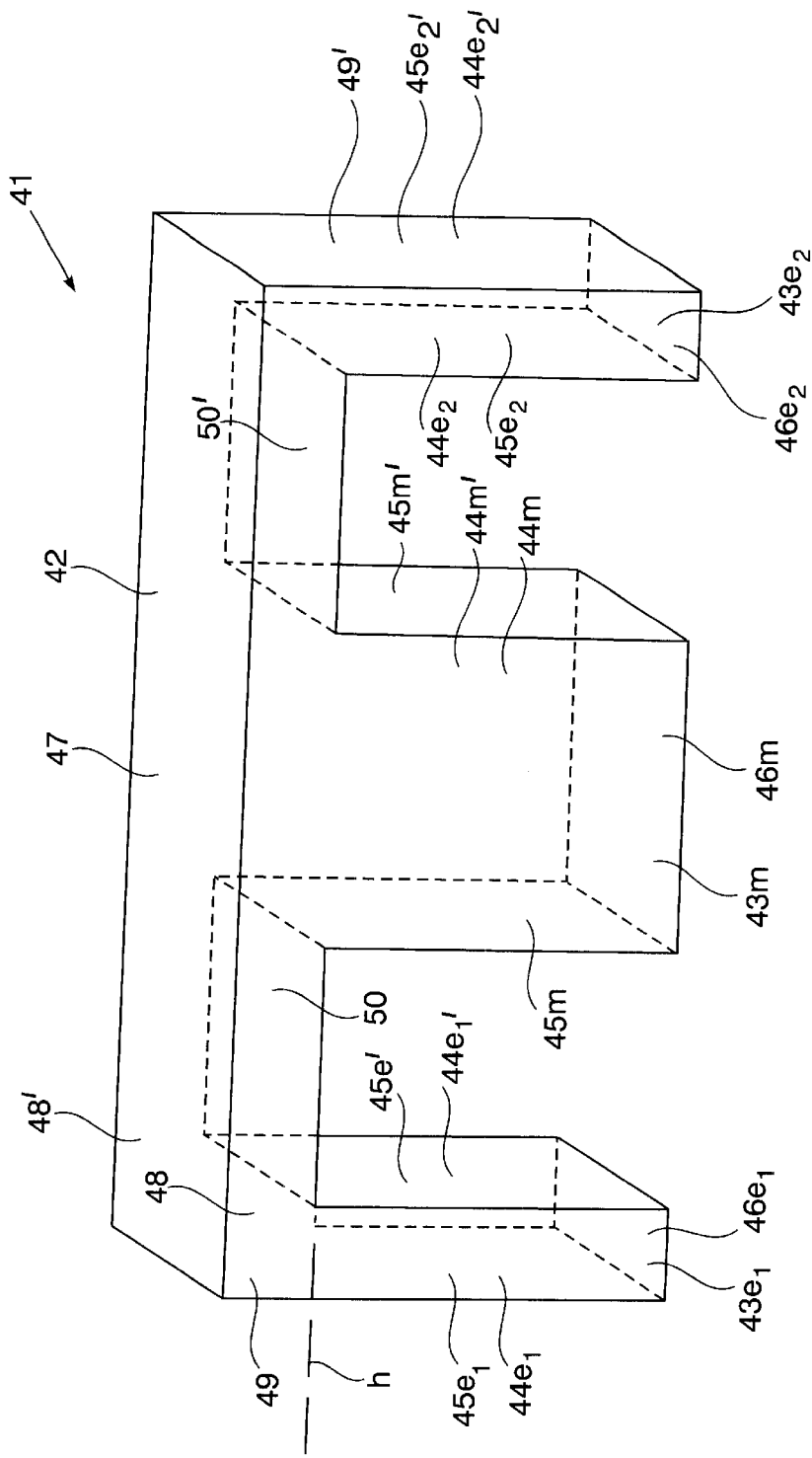
FIG. 6 is a diagrammatic perspective view of the "E" core of the inventive prototype magnetic field intensity H FSMFS shown situated on a ferromagnetic (e.g, hull) surface in FIG. 5.
Figure 7:
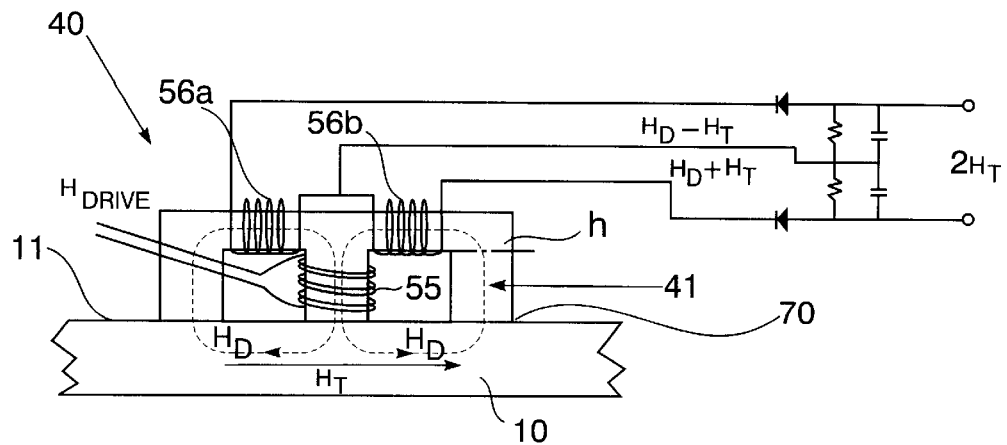
FIG. 7 is a diagrammatic circuit and cutaway elevation view of the "E" core for the inventive prototype magnetic field intensity H ("E" core) FSMFS shown situated on a ferromagnetic (e.g, hull) surface in FIG. 5.

Still referring to FIG. 5 and also referring to FIG. 6 and FIG. 7, the U.S. Navy's inventive prototype transverse H field component sensor 40 has a tangential H field measurement core design comprising magnetic material and characterized by an "E"-shaped geometry. Transverse H field component sensor 40 resembles in shape the letter "E"—the upper case form of the fifth letter of the English language alphabet.

Although E core 41 of transverse H field component sensor 40 is a unitary member, for geometrically descriptive purposes E core 41 can be considered to be regionalized so as to have a base 42 section and (demarcated with respect thereto via intersecting plane h, indicated with dashed line) three approximately parallel "leg" 43 sections which are each approximately perpendicular to base 42 and are approximately parallel to each other. Base 42 is shown to be approximately horizontal, and is approximately vertical when the letter "E" is upright. Legs 43 are shown to be approximately vertical, and are approximately horizontal when the letter "E" is upright.

The three legs 43 can be designatively differentiated among themselves as middle leg 43m and two end legs $43e_1$ and $43e_2$. The three legs 43m, $43e_1$ and $43e_2$ are each approximately vertical and approximately perpendicular to base 42, and are approximately perpendicular to ferromagnetic surface 11 when transverse H field component sensor 40 is appropriately situated.

E core 41 has a rectilinear configuration formed by approximately flat (planar) surfaces sharing approximately straight (linear) edges with adjacent surfaces and oriented approximately orthogonally with respect to the adjacent surfaces. Base 42 and legs 43m, $43e_1$ and $43e_2$ each approximately describe a rectangular parallelepiped. Legs 43m, $43e_1$ and $43e_2$ are approximately congruent rectangular parallelepipeds. Leg 43m is approximately equidistant between leg $43e_1$ and leg $43e_2$.

Legs 43m, $43e_1$ and $43e_2$ each have four exposed side surfaces and, perpendicular thereto, an exposed end bottom or lower) surface. Leg 43m has two approximately parallel lengthwise side surfaces 44m and 44m' and, approximately perpendicular thereto, two approximately parallel widthwise side surfaces 45m and 45m' and a bottom surface 46m. Leg $43e_1$ has two approximately parallel lengthwise side surfaces $44e_1$ and $44e_1$' and, approximately perpendicular thereto, two approximately parallel widthwise side surfaces $45e_1$ and $45e_1$' and an end (bottom) surface $46e_1$. Leg $44e_2$ has two approximately parallel lengthwise side surfaces $44e_2$ and $44e_2$' and, approximately perpendicular thereto, two approximately parallel widthwise side surfaces $45e_2$ and $45e_2$' and an end (bottom) surface $46e_2$. The distance between widthwise side surface $45e_1$' and widthwise side surface 45m approximately equals the distance between widthwise side surface $45e_2$ and widthwise side surface 45m'.

Base 42 has an exposed top (upper) surface 47, two approximately parallel exposed lengthwise side surfaces 48 and 48', two approximately parallel exposed widthwise side surfaces 49 and 49', and two exposed bottom (lower) surfaces 50 and 50' which are staggered in relation to legs 43. Top base surface 47 and bottom base surfaces 50 and 50' are approximately parallel to leg end surfaces $46e_1$, 46m and $46e_2$ and to each other. The three leg end surfaces $46e_1$, 46m and $46e_2$ are approximately congruent and approximately coplanar. Lengthwise base side surface 48 and lengthwise leg side surfaces $44e_1$, 44m and $44e_2$ are approximately coplanar. Lengthwise base side surface 48' and lengthwise leg side surfaces $44e_1'$, $44m'$ and $44e_2'$ are approximately coplanar. Widthwise base side surface 49 and widthwise leg side surface $45e_1$ are approximately coplanar. Widthwise base side surface 49' and widthwise leg side surface $45e_2'$ are approximately coplanar.

When appropriately positioned relative to a ferromagnetic surface 11 of ferromagnetic material (e.g., hull plate) 10, transverse H field component sensor 40 is situated whereby the letter "E" described by E core 41 is sideways adjacent to ferromagnetic surface 11, so that the three leg end surfaces $45e_1$, $45m$ and $45e_2$ abut ferromagnetic surface 11. As shown in FIG. 5 and FIG. 7, E core 41 when situated atop ferromagnetic surface 11 is like a letter "E" rotated ninety degrees. Base 42 and ferromagnetic surface 11, as depicted in FIG. 5 and FIG. 7, are each approximately horizontal. It should be understood, however, that normal B field component sensor 30 and transverse H field component sensor 40 can each be inventively practiced having any orientation in space.

A purpose of the present invention's "E"-shaped transducer core geometry, as defined by E core 41, is to measure the H component of field intensity in much the same way as would a fluxgate double rod magnetometer or a ring core magnetometer. The drive winding 55 is wound around middle leg $43m$, and applies an H drive field $H_D$ which is divided into two $H_D$ semiportions corresponding to both lateral ends (viz., the leg $43e_1$ end and the leg $43e_2$ end) of E core 41.

Sense windings 56a and 56b are wound, respectively, over the portions of base 42 having exposed bottom (lower) surfaces 50 and 50', respectively. The amplitude of the induced field in each of sense windings 56a and 56b is dependent on the amplitude of $(H_D+H_T)$ and $(H_D-H_T)$. A simple peak difference demodulator used by the Brown Magnetometer shows that the resultant is equal to $2 H_T$. A number of detectors could be used, including the amplitude-dependent second harmonic phase detector techniques used by most present high quality fluxgate magnetometers.

Calibration windings 57 are wound over legs $43m$, $43e_1$ and $43e_2$. The middle calibration winding 57 is wound over drive winding 55 which is directly wound on leg $43m$. A calibration winding 57 is generally necessary for inventive practice of transverse H field component sensor 40, and would be wound on each of legs $43m$, $43e_1$ and $43e_2$ of E core 41, to calibrate the changes to absolute field values.

As illustrated in FIG. 7, when transverse H field component sensor 40 is appropriately driven, two closed magnetic flux paths manifest themselves. A first closed magnetic flux path is formed through base 42, leg $43e_1$, ferromagnetic material 10 and leg $43m$. A second closed magnetic flux path is formed through base 42, leg $43e_2$, ferromagnetic material 10 and leg $43m$.

Figure 9:
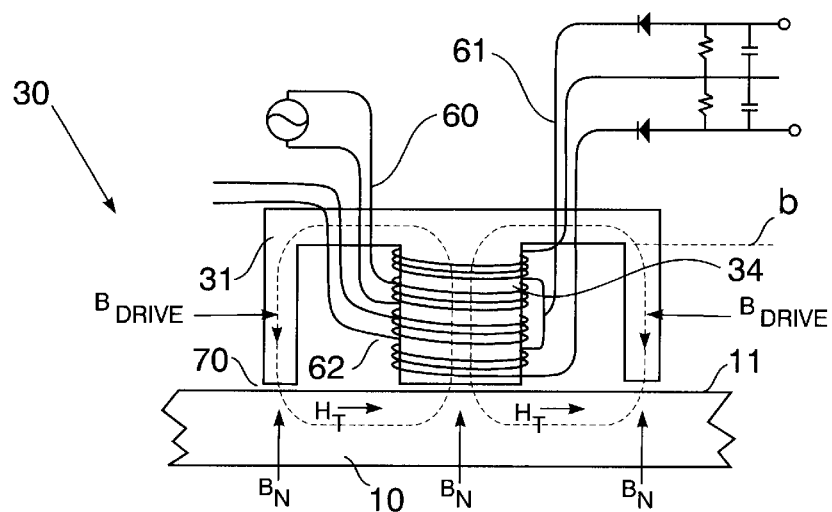
FIG. 9 is a diagrammatic circuit and cutaway elevation view of the inventive prototype magnetic induction B ("Pot" core) FSMFS shown situated on a ferromagnetic (e.g., hull) surface in FIG. 5.
Figure 8:
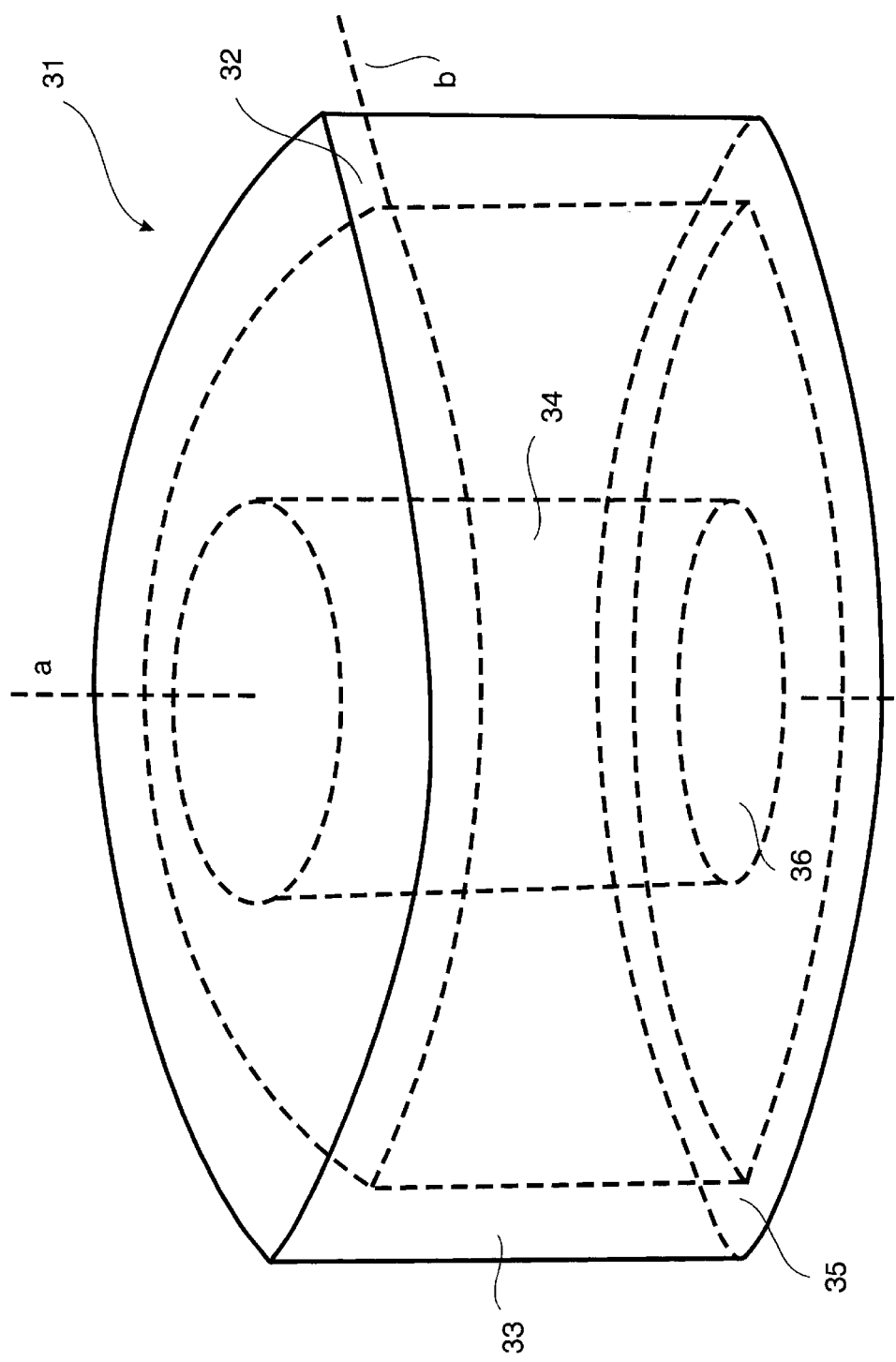
FIG. 8 is a diagrammatic perspective view of the "Pot" core of the inventive prototype magnetic induction B FSMFS shown situated on a ferromagnetic (e.g, hull) surface in FIG. 5.

Still referring to FIG. 5 and also referring to FIG. 8 and FIG. 9, normal B field component sensor 30 employs a Pot core 31 which measures the $B_N$ component after spatially averaging out all $H_T$ fields. Geometrically, Pot core 31 has a coaxially doubly cylindrical character and bears resemblance to a "pot," and can be considered to be akin to an E core 41 which is rotated three hundred sixty degrees (360°), thereby canceling out the measured $H_T$ component of field. As illustrated in FIG. 9, drive winding 60 applies a B drive field $B_D$ wherein $(B_D+B_N)A_{Outside}=(B_D-B_N)A_{Inside}$, wherein A is the amplitude of the induced field.

Although Pot core 31 of normal B field component sensor 30 is a unitary member, for geometrically descriptive purposes Pot core 31 can be considered to be regionalized so as to have a solid disk 32 section, a hollow major cylinder 33 section and (demarcated with respect thereto via intersecting plane b, indicated with dashed line) a solid minor cylinder 34 section. The combination of disk 32 and hollow major cylinder 33 describes a continuous (unbroken) "pot" shape—that is, the shape of a cylindrical container or receptacle.

Disk 32, hollow major cylinder 33 and solid minor cylinder 34 are approximately coaxial. Otherwise stated, the respective peripheries of disk 32, hollow major cylinder 33 and solid minor cylinder 34 are approximately symmetrical with respect to the same axis of symmetry a. Disk 32 is approximately circular, and hollow major cylinder 33 and solid minor cylinder 34 are each approximately cylindrical. Hollow major cylinder 33 has an annular bottom surface 35. Solid minor cylinder 34 has a circular bottom surface 36. Annular bottom surface 35 and circular bottom surface 36 are approximately coplanar.

Solid minor cylinder 34 has a minor cylindrical surface 37. As shown in FIG. 5 and FIG. 9, drive winding 60, sense winding 61 and calibration winding 62 are each wound around minor cylindrical surface 37 in the interior of Pot core 31. Drive winding 60 is the innermost winding. Sense winding 61 is wound over drive winding 60. Calibration winding 62 is wound over sense winding 61. Drive winding 60 and sense winding 61 are only affected by the magnitude of the $B_N$ field. As is the case for E core 41 of transverse H field component sensor 40, a calibration winding 62 is generally necessary for Pot core 31 of normal B field component sensor 30, so that the amplitude of the component can be measured accurately.

As illustrated in FIG. 9, when normal B field component sensor 30 is appropriately driven, a closed magnetic flux path describing a sort of "donut" shape manifests itself. The closed magnetic flux path is formed through solid disk 32 section, hollow major cylinder 33 section, ferromagnetic material 10 and solid minor cylinder 34 section.

A main feature of the combined transducer in accordance with the present invention is the measurement of the surface $B_N$ and $H_T$ fields using the ferromagnetic (e.g., hull) material as part of the transducer element. Each of inventive component transducers 31 and 41 individually measures the magnetic condition of the hull and uses it as part of its transducer element. Inventive transducer 30 senses magnetic flux in its Pot core 31, and inventive transducer 40 senses magnetic flux in its E core 41. The magnetic state characterized by the hysteresis loop of the ferromagnetic material will be reflected in the value of the surface fields. According to this invention, the normal and tangential magnetic field components can be measured very closely in space with respect to the ferromagnetic surface.

It is believed that no known methodology can accomplish measurement of normal and tangential magnetic field components as well or as easily as can the inventive methodology. Conventional "Hall-effect" sensors would perhaps be capable of measuring $B_N$ fields. However, measurement of the $H_T$ fields according to known devices and techniques would be difficult and problematical, because this would require modifying the ferromagnetic (e.g., hull) material.

FIGS. 6-5 of the above-mentioned U.S. Navy technical report NSWCCD-TR-98/011 by John F. Scarzello and Edward C. O'Keefe is a photograph of a U.S. Navy tensile testing machine modified to apply stress to a ½" thick toroidal plate of HY-130. The plate is wound with coils so that a hysteresis curve of toroidal plate can be measured as a function of stress, and correlated with the measurements from the present invention's prototype $B_N$ and $H_T$ sensors. Ambient fields B are applied normal to the toroidal plate by placing it inside a Helmholtz coil, while $H_T$ fields are applied by a separate toroidal calibration winding. In this test installation, the magnetic condition of the test plates can be measured and a comparison made to the prototype inventive sensors.

Experimental ferrite cores, shown in FIGS. 6-4 of the above-mentioned U.S. Navy technical report NSWCCD-TR-98/011 by John F. Scarzello and Edward C. O'Keefe, are being used by the U.S. Navy first to measure the magnetic characteristics of an HY-80 hull sample with a lapped contact surface that is placed in a two-axis Helmholtz coil to test the inventive prototype sensor. Modified electronics from the U.S. Navy's prototype IFM are being used for the U.S. Navy's prototype Pot core 31 and E core 41. Toroidal core permeability standards, used to periodically check the measurement electronics, are also pictured in FIGS. 6-4 of the above-mentioned U.S. Navy technical report NSWCCD-TR-98/011 by John F. Scarzello and Edward C. O'Keefe. Experimental transducer cores can also be made of laminated silicon steel or other high-induction, soft ferromagnetic materials, and tape wound Pot cores 31 with laminated top disks. Generally speaking, there are numerous transducer core materials that can be used in accordance with this invention, including both crystalline and amorphous material cores. The transducer size will be varied to obtain the desire resolution and dynamic operating range of the material.

Generally, the following are critical issues for inventive practice: (i) calibration; (ii) attachment to the hull or other ferromagnetic material (iii) stability with respect to time and temperature; and, (iv) sensitivity. Regardless of whether the present invention's E core 41 or the present invention's Pot core 31 is being practiced, the interface between the ferromagnetic (e.g., hull) material and the present invention's measuring transducer core normally is critical. Referring again to FIG. 5, FIG. 7 and FIG. 9, ferromagnetic material surface 11 must be a "lapped" surface so that there is almost a transparent boundary of appreciable thickness between ferromagnetic material 10 and the present invention's measuring transducer core—either E core 41 or Pot core 31, as the case may be.

In the real world, an "ideal" interface may be difficult to achieve. Nevertheless, a very thin sheet of soft magnetic material may be used as an interface 70, and should be satisfactory as long as its thickness is much less than the dimensions of the present invention's measuring transducer core. The use of ferro-fluid type materials may also be possible to ensure a continuous and uniform flux path between the ferromagnetic material 10 and the present invention's measurement transducer core (whether it is Pot core 31 or E core 41).

As shown in FIG. 5 through FIG. 7, interface 70 is present between ferromagnetic surface 11 and the three leg end (bottom) surfaces $45e_1$, $45m$ and $45e_2$. As shown in FIG. 5, FIG. 8 and FIG. 9, interface 70 is present between ferromagnetic surface 11 and the two round bottom surfaces, viz., annular bottom surface 35 and circular unbroken bottom surface 36. Interface 70 is shown to be thicker in FIG. 9 than in FIG. 7, but this is for illustrative purposes; neither E core 41 nor Pot core 31 would necessarily require a thicker or thinner interface vis-a-vis each other, and such considerations pertaining to interface thicknesses depend on the individual embodiments.

In inventive practice, E core 41 or Pot core 31 will generally be positioned so as to be at least slightly distanced from the surface of the ferromagnetic material being sensed. The inventive IFM and the inventive SIM will each also be at least slightly distanced from the ferromagnetic material surface. Neither the inventive FSMFS, nor the inventive IFM, nor the inventive SIM is dimensionally or configurationally unwieldy; in ship applications, the inventive FSMFS and/or the inventive IFM and/or the inventive SIM can be rather facilely integrated with a ship or submarine hull, giving reliable performance without necessitating inordinate amounts of hull penetrations and conductors. The U.S. Navy envisions embedding or incorporating each of E core 41 or Pot core 31 in a relatively thick coating provided on the ferromagnetic hull, whereby each of sensor 40 and sensor 30 adjoins the ferromagnetic hull surface but is proximately separated therefrom. The inventive IFM and the inventive SIM can also be embedded in the ship's hull in this manner.

Other embodiments of the inventions disclosed herein will be apparent to those skilled in the art from a consideration of this disclosure or practice of the invention disclosed herein. Various omissions, modifications and changes to the principles described may be made by one skilled in the art without departing from the true scope and spirit of the invention which is indicated by the following claims.

What is claimed is:

1. A fluxgate device for sensing the transverse component of the magnetic field intensity H at a surface area of a ferromagnetic entity, said device comprising:

a magnetic core which generally describes a three-dimensional "E" shape, said magnetic core including four portions, said four portions being a base portion and three leg portions each projecting from said base portion, said three leg portions being a first end leg portion, a second end leg portion and a middle leg portion, said middle leg portion being approximately equidistantly interposed between said first end leg portion and said second end leg portion, said first end leg portion, said second end leg portion and said middle leg portion each having a leg end surface for being situated adjacent said surface area of said ferromagnetic entity when said device is positioned with respect to said ferromagnetic entity;

a drive winding which is wound over said middle leg portion;

two sense windings, said two sense windings being a first sense winding and a second sense winding, said first sense winding being wound over said base portion between said first end leg portion and said middle leg portion, said second sense winding being wound over said base portion between said second end leg portion and said middle leg portion; and three calibration windings, said three calibration windings being a first calibraton winding, a second calibration winding and a third calibration winding, said first calibration winding being wound over said first end leg portion, said second calibration winding being wound over said middle leg portion, said third calibration winding being wound over said second end leg portion.

2. The device according to claim 1, wherein, when said device is positioned with respect to said ferromagnetic entity and is driven:

a first closed magnetic flux path is formed through said base portion, said first end leg portion, said ferromagnetic entity and said middle leg portion; and a second closed magnetic flux path is formed through said base portion, said second leg portion, said ferromagnetic entity and said middle leg portion.

3. The device according to claim 2, wherein said first end leg portion, said second end leg portion and said middle leg portion are each approximately parallel to each other and approximately perpendicular to said base portion.

4. The device according to claim 3, wherein:
   said first end leg portion, said second end leg portion and said middle leg portion are each approximately coextensive;
   said leg end surfaces are each approximately planar; and
   said leg end surfaces are approximately coplanar with respect to each other.

5. The device according to claim 4, wherein said base portion, said first end leg portion, said second end leg portion and said middle leg portion each approximately describe a rectangular parallelipiped shape.

6. The device according to claim 2, said apparatus further comprising an interfacial material substantially characterized by magnetic transparency, said interfacial material being situated between each said leg end and said surface area of said ferromagnetic entity.

7. A fluxgate device for sensing the normal component of the magnetic induction B at a surface area of a ferromagnetic entity, said device comprising:
   a magnetic core which generally describes a semi-open coaxial double-cylinder shape, said magnetic core including an approximately cylindrical bucket-shaped portion and an approximately cylindrical solid portion, said approximately cylindrical solid portion having a smaller diameter than has said approximately cylindrical bucket-shaped portion, said approximately cylindrical bucket-shaped portion having an annular end surface, said approximately cylindrical solid portion having a continuous circular end surface, said annular end surface and said continuous circular end surface being for being situated adjacent said surface area of said ferromagnetic entity when said device is positioned with respect to said ferromagnetic entity;
   a drive winding which is wound over said approximately cylindrical solid portion;
   a sense winding which is wound over said approximately cylindrical solid portion; and
   a calibration winding which is wound over said approximately cylindrical solid portion.

8. The device according to claim 7, wherein, when said device is positioned with respect to said ferromagnetic entity and is driven, a closed magnetic flux path is formed through said approximately cylindrical bucket-shaped portion, said ferromagnetic entity and said approximately cylindrical solid portion.

9. The device according to claim 8, wherein:
   said annular end surface and said continuous circular end surface are each approximately coextensive;
   said annular end surface and said continuous circular end surface are each approximately planar; and
   said annular end surface and said continuous circular end surface are approximately coplanar with respect to each other.

10. The device according to claim 8, said apparatus further comprising an interfacial material substantially characterized by magnetic transparency, said interfacial material being situated:
   between said annular end surface and said surface area of said ferromagnetic entity; and
   between said continuous circular end surface and said surface area of said ferromagnetic entity.

11. Apparatus for sensing a magnetic field at a surface area of a ferromagnetic entity, said apparatus comprising:
   a first fluxgate device, said first fluxgate device being for sensing the transverse component of the magnetic field intensity H at said surface area of said ferromagnetic entity, said first fluxgate device comprising a magnetic core, drive winding means and sense winding means, said sense winding means including two sense windings, said magnetic core generally describing a three-dimensional "E" shape, said core including four portions, said four portions being a base portion and three leg portions each projecting from said base portion, said three leg portions being a first end leg portion, a second end leg portion and a middle leg portion, said middle leg portion being approximately equidistantly interposed between said first end leg portion and said second end leg portion, said first end leg portion, said second end leg portion and said middle leg portion each having a leg end surface for being situated adjacent said surface area of said ferromagnetic entity when said first fluxgate device is positioned with respect to said ferromagnetic entity, said drive winding being wound over said middle leg portion, said two sense windings being a first sense winding and a second sense winding, said first sense winding being wound over said base portion between said first end leg portion and said middle leg portion, said second sense winding being wound over said base portion between said second end leg portion and said middle leg portion; and
   a second fluxgate device, said second fluxgate device being for sensing the normal component of the magnetic induction B at said surface area of said ferromagnetic entity, said second fluxgate device comprising a magnetic core, drive winding means and sense winding means, said drive winding means including a drive winding, said sense winding means including a sense winding, said magnetic core generally describing a semi-open coaxial double-cylinder shape, said magnetic core including an approximately cylindrical bucket-shaped portion and an approximately cylindrical solid portion, said approximately cylindrical solid portion having a smaller diameter than has said approximately cylindrical bucket-shaped portion, said approximately cylindrical bucket-shaped portion having an annular end surface, said approximately cylindrical solid portion having a continuous circular end surface, said annular end surface and said continuous circular end surface being for being situated adjacent said surface area of said ferromagnetic entity when said second fluxgate device is positioned with respect to said ferromagnetic entity, said drive winding being wound over said approximately cylindrical solid portion, said sense winding being wound over said approximately cylindrical solid portion;
   wherein, when said first fluxgate device and said second fluxgate device are each positioned with respect to said ferromagnetic entity, said first fluxgate device and said second fluxgate device are adjacent to each other.

12. Apparatus for sensing a magnetic field as recited in claim 11, said apparatus further comprising calibration winding means for said first fluxgate device, said calibration winding means including three calibration windings, said three calibration windings being a first calibraton winding, a second calibration winding and a third calibration winding, said first calibration winding being wound over said first end leg portion, said second calibration winding being wound over said middle leg portion, said third calibration winding being wound over said second end leg portion.

13. Apparatus for sensing a magnetic field as recited in claim 12, wherein, when said first fluxgate device is positioned with respect to said ferromagnetic entity and is driven:
   a first closed magnetic flux path is formed through said base portion, said first end leg portion, said ferromagnetic entity and said middle leg portion; and
   a second closed magnetic flux path is formed through said base portion, said second leg portion, said ferromagnetic entity and said middle leg portion.

14. Apparatus for sensing a magnetic field as recited in claim 13, wherein:
   said first end leg portion, said second end leg portion and said middle leg portion are each approximately parallel to each other and approximately perpendicular to said base portion;
   said first end leg portion, said second end leg portion and said middle leg portion are each approximately coextensive;
   said leg end surfaces are each approximately planar;
   said leg end surfaces are approximately coplanar with respect to each other; and
   said base portion, said first end leg portion, said second end leg portion and said middle leg portion each approximately describe a rectangular parallelipiped shape.

15. Apparatus for sensing a magnetic field as recited in claim 14, wherein:
   said annular end surface and said continuous circular end surface are each approximately coextensive;
   said annular end surface and said continuous circular end surface are each approximately planar; and
   said annular end surface and said continuous circular end surface are approximately coplanar with respect to each other.

16. Apparatus for sensing a magnetic field as recited in claim 11, said apparatus further comprising calibration winding means for said second fluxgate device, said calibration winding means including a calibration winding, said calibration winding being wound over said approximately cylindrical solid portion.

17. Apparatus for sensing a magnetic field as recited in claim 16, wherein, when said second fluxgate device is positioned with respect to said ferromagnetic entity and is driven, a closed magnetic flux path is formed through said approximately cylindrical bucket-shaped portion, said ferromagnetic entity and said approximately cylindrical solid portion.

18. Apparatus for sensing a magnetic field as recited in claim 17, wherein:
   said annular end surface and said continuous circular end surface are each approximately coextensive;
   said annular end surface and said continuous circular end surface are each approximately planar; and
   said annular end surface and said continuous circular end surface are approximately coplanar with respect to each other.

19. Apparatus for sensing a magnetic field as recited in claim 14, said apparatus further comprising:
   calibration winding means for said first fluxgate device, said calibration winding means including a first calibraton winding, a second calibration winding and a third calibration winding, said first calibration winding being wound over said first end leg portion, said second calibration winding being wound over said middle leg portion, said third calibration winding being wound over said second end leg portion; and
   calibration winding means for said second fluxgate device, said calibration winding means including a calibration winding being wound over said approximately cylindrical solid portion.

20. Apparatus for sensing a magnetic field as recited in claim 11, said apparatus further comprising an interfacial material substantially characterized by magnetic transparency, said interfacial material being situated:
   between each said leg end and said surface area of said ferromagnetic entity;
   between said annular end surface and said surface area of said ferromagnetic entity; and
   between said continuous circular end surface and said surface area of said ferromagnetic entity.

* * * * *